United States Patent
Zheng

(10) Patent No.: US 6,306,755 B1
(45) Date of Patent: Oct. 23, 2001

(54) METHOD FOR ENDPOINT DETECTION DURING DRY ETCH OF SUBMICRON FEATURES IN A SEMICONDUCTOR DEVICE

(75) Inventor: Tammy Zheng, Fremont, CA (US)

(73) Assignee: KoninKlijke Philips Electronics N.V. (KPENV), Eindhoven (NL)

( * ) Notice: Subject to any disclaimer, the term of this patent is extended or adjusted under 35 U.S.C. 154(b) by 0 days.

(21) Appl. No.: 09/312,730

(22) Filed: May 14, 1999

(51) Int. Cl.[7] ............................................... H01L 21/4763
(52) U.S. Cl. ......................... 438/631; 438/618; 438/633
(58) Field of Search ..................................... 438/631, 692, 438/693, 697, 707–709, 618, 633

(56) References Cited

U.S. PATENT DOCUMENTS

| | | |
|---|---|---|
| 3,841,031 | 10/1974 | Walsh . |
| 4,312,732 | 1/1982 | Degenkolb et al. . |
| 5,036,015 | 7/1991 | Sandhu et al. . |
| 5,321,304 | 6/1994 | Rostoker . |
| 5,747,380 * | 5/1998 | Yu et al. ................................. 438/599 |
| 5,980,767 * | 11/1999 | Koshimizu ............................... 216/60 |
| 6,093,631 * | 7/2000 | Jaso et al. .............................. 438/618 |
| 6,104,487 * | 8/2000 | Buck et al. ............................. 356/316 |

* cited by examiner

Primary Examiner—David Nelms
Assistant Examiner—Dung A Le

(57) ABSTRACT

According to an example embodiment, the present invention is directed to a method for manufacturing a semiconductor device. The device includes a conductive underlayer. A sub-micron via or contact path and a dummy via or dummy contact path are dry etched. The endpoint of the dry etching process is optically detected, and the etching process is stopped responsive to the detection of the endpoint. By etching a dummy via or contact in addition to the submicron via or contact, this example embodiment facilitates endpoint detection for dry etching sub-micron features in semiconductor devices, which is otherwise difficult or even impossible in the submicron regime.

19 Claims, 2 Drawing Sheets

METHOD FOR ENDPOINT DETECTION DURING DRY ETCH OF SUBMICRON FEATURES IN A SEMICONDUCTOR DEVICE

FIELD OF THE INVENTION

The present device relates generally to semiconductor devices and their manufacture and, more particularly, to semiconductor devices and their manufacture involving end point detection during a dry etching process.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. In addition, many of the individual devices within the wafer are being manufactured with smaller physical dimensions. As the number of electronic devices per given area of the silicon wafer increases, and as the size of the individual devices decreases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS), complementary MOS (CMOS), bipolar complementary MOS (BiCMOS), and bipolar transistors.

The manufacture of such semiconductor devices often includes the creation of structure within the device including metal layers and individual devices having small physical dimensions. The metal layers and individual devices must be arranged according to the device specifications, which often require etching in order to create the desired shapes, patterns, or connections.

For instance, it is sometimes necessary to create electrical connections between metal layers within the device. Typically, a dielectric material is located between metal layers and acts as an insulator. Via etch is a process that may be used to open holes through the dielectric in order to allow the creation of a connection between the conductive layers. Once a hole is created, material is placed in the hole, creating the connection between layers of metal within the device. In addition, it is also sometimes necessary to create contacts for regions in the device, such as gate, source, drain, or field isolation regions. Contact etching may be used to open contact holes to the devices. Once a hole is created, material is placed in the contact hole, creating a contact connection to the device.

When creating holes in the dielectric for making an electrical connection, it is often important that the etching pass through all of the dielectric material and expose the underlying conductive layer and stop precisely at the desired point. A method for etching the dielectric without etching the metal is selective etching. Selective etching is a process by which an etchant is used that etches only the dielectric, leaving the metal relatively intact. When a non-selective etching process is used, accurate determination of the endpoint is necessary to prevent over-etching and also under-etching.

Wet etching is a low-cost, reliable, high throughput process that has been used in semiconductor fabrication. Wet etching may also be selective, making detection of the endpoint of the etching process less necessary. However, wet etching is limited in that it does not adequately perform the etching process when the features needed to be defined, such as the size of a hole needing to be etched, is less than about 3 microns wide. This limitation is due to the fact that wet etching is an isotropic process, which results in undercutting of the dielectric during the etching process when the thickness of the film being etched is comparable to the width of the pattern being etched. Since many films used in semiconductor device fabrication are in a range of less than 3 microns, creating patterns in a range of less than 3 microns becomes difficult. Therefore, wet-etching is not suitable for use in the formation of via holes or contact holes wherein the width of such holes is less than 3 microns, and particularly not suitable when the width of such holes is less than 0.25 microns.

Dry etching is an alternative to wet etching that can be used for etching in the sub-3 micron range, since it offers the capability of anisotropic etching. Dry etching includes processes such as physical sputtering, ion beam milling, reactive ion etching (RIE), and plasma etching. Although dry etching may be performed anisotropically, it does not exhibit the high selectivity to substrate and mask material that is available with wet etching systems.

Detecting the endpoint of the dry etch process for sub-0.25 micrometer contact and via etch processes is a challenge. For sub-micron technologies, at contact and via layers, the typical exposed area may be less than 2% of the total wafer area. In some cases, the exposed area could be less than 1%. This small area may render optical detection of etch end point impossible due to a weak signal. Timed etch contact and via etch processes are used instead of optical detection. However, with timed etch processes, good via and contact etch process control becomes difficult due to the over-etching and under-etching issues discussed above. Dielectric film thicknesses, film composition, dielectric etch rate, uniformity, selectivity to the under-layer, etc., all have a major impact on the contact and via etch process control, possibly leading to device failure and reliability problems. Therefore, endpoint detection capability is important for developing a manufacturable sub-micron contact or via etch processes.

SUMMARY OF THE INVENTION

The present invention makes possible endpoint detection for dry etching sub-micron features in semiconductor devices, and is exemplified in a number of implementations and applications, some of which are summarized below. According to an example embodiment, the present invention is directed to a method for manufacturing a semiconductor device, wherein the device includes a conductive underlayer. A sub-micron via or contact path and a dummy via or dummy contact path are dry etched. The endpoint of the dry etching process is optically detected, and the etching process is stopped responsive to the detection of the endpoint.

According to another example embodiment, the present invention is directed to a method for manufacturing a semiconductor device, wherein the device includes a conductive underlayer, such as metal, silicon, silicide or even poly. A sub-micron contact path and a dummy contact path are dry etched. The endpoint of the dry etching process is optically detected, and the etching process is stopped responsive to the detection of the endpoint.

The above summary of the invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
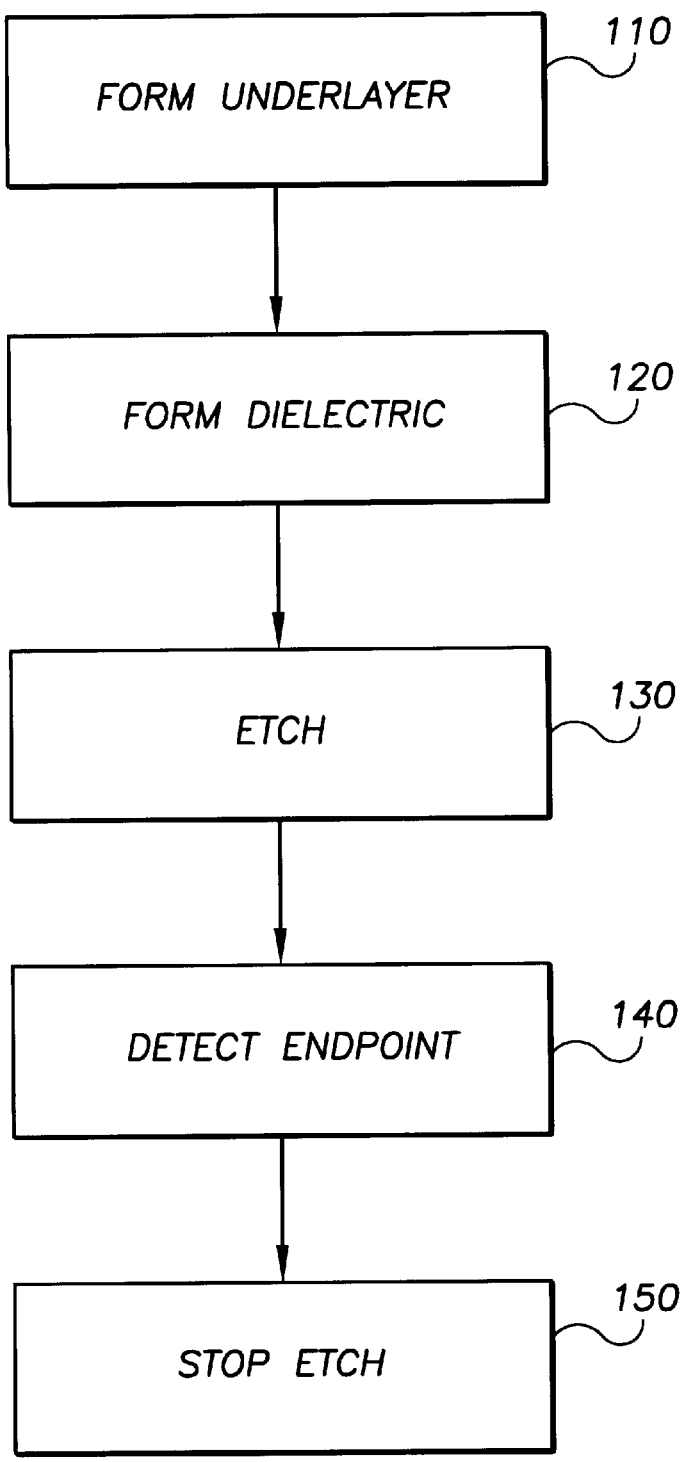
FIG. 1 shows a flowchart of a method for manufacturing a semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for dry etching in connection with devices requiring or benefiting from submicron via and contact etching. While the present invention is not limited to such devices, an appreciation of various aspects of the invention is best gained through a discussion of various examples using this application.

Dry etching is particularly advantageous for use in forming sub-micron paths because it can be accomplished using an anisotropic process that does not exhibit the negative effects, such as undercutting, that isotropic wet etching exhibits. Typical dry etching processes include, for instance, physical sputtering, ion beam milling, reactive ion etching (RIE), and plasma etching. When dry etching using a non-selective etchant, endpoint detection is particularly important for successful etching without disturbing the metal layer under the desired path to be etched. Effective endpoint detection is better attained when the etching process results in a total etched area of at least about 2% of the total wafer area.

According to an example embodiment, the present invention is directed to a method for manufacturing a semiconductor device, wherein the device includes a conductive underlayer. At least one sub-micron path and at least one dummy path are dry etched. The endpoint of the dry etching process is optically detected, and the etching process is stopped responsive to the detection of the endpoint. The sub-micron path may, for instance, be used as a via or as a contact. In another embodiment, the etched area of the dummy path and the sub-micron path is at least about 2% of the total wafer area.

Dummy paths may be located in several areas within the device. For instance, dummy paths may be formed at scribe lines that are often included with semiconductor devices. Such scribe lines are often used to show the location of devices, break lines, or other layout features within the device. In addition, semiconductor devices include field areas. Field areas are another location that may be used for the formation of dummy paths.

Dummy paths may be formed over a number of regions, including over existing underlayer metal or over regions, such as gate, source, drain, or other regions, formed as part of the normal manufacture of the semiconductor device. However, in some instances, underlayer metal or other regions are not available in the areas in which the dummy paths are desired to be formed. According to another example embodiment of the present invention, dummy underlayer metal is added during an underlayer metal patterning step. The underlayer metal may be added in the scribe areas, field areas, or other areas within the device. In another example embodiment, at least one dummy pattern is added during a step, such as the gate patterning step or the field patterning step. The dummy pattern may include, for example, a dummy gate stack pattern, or a dummy field pattern.

After the paths are formed, metal may be formed in the paths to create vias. Such vias may be used to couple metal layers in the device. In addition, metal may be formed in the paths to create contacts. Such contacts may be used to couple to patterns or devices within the device, such as source, drain, gate, or pattern regions. It is sometimes advantageous to couple dummy contacts to only one type of underlayer in order to maximize endpoint signal. In another example embodiment, the dummy contacts are only coupled to multiple types of underlayers.

Figure 2:
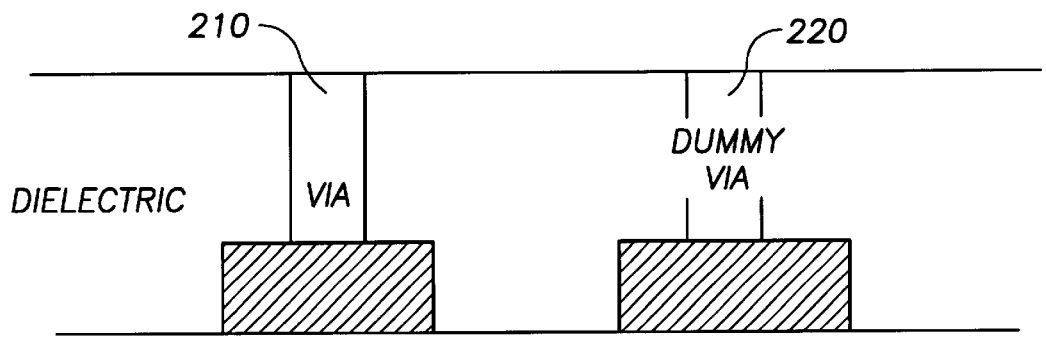
FIG. 2 shows a via and a dummy via according to another example embodiment of the present invention.
Figure 3:
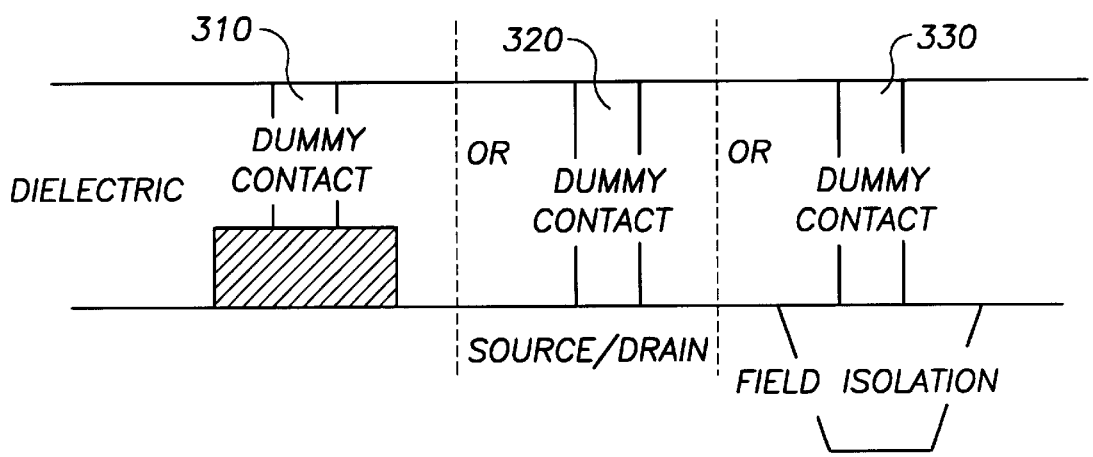
FIG. 3 shows three example dummy contacts, according to yet another example embodiment of the present invention.

Referring now to FIGS. 1–3, the present invention is directed to a method for manufacturing a semiconductor device, according to another example embodiment of the present invention. Referring to FIG. 1, an underlayer is formed within a semiconductor device at 110. A dielectric layer is formed over the underlayer at 120. The dielectric layer is etched at 130 and at least one submicron path and at least one dummy path are formed. The endpoint of the etching process is optically detected at 140, and the etching process is stopped at 150 in response to the detection of the endpoint. In another example embodiment, the underlayer formation at 110 may include the formation of dummy underlayer material.

An example result of the etching process as used for forming vias is shown in FIG. 2, wherein a submicron via 210 and a dummy via 220 are formed over a metal underlayer. Partial example results of the etching process are shown in FIG. 3. For instance, a dummy contact 310 may be formed over a gate region. Also, a dummy contact 320 may be formed over source/drain regions. In addition, a dummy contact 330 may be formed over a field isolation region. Typically, such dummy via or dummy contact does not connect to active devices.

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing a semiconductor device comprising:

forming a conductive underlayer;

forming a selective layer over the conductive underlayer;

dry etching at least one sub-micron path;

concurrently dry etching at least one dummy path;

detecting the endpoint of the etching process; and stopping the etching process responsive to the optical detection of the endpoint.

2. A method for manufacturing a semiconductor device, according to claim 1, wherein dry etching includes plasma etching.

3. A method for manufacturing a semiconductor device, according to claim 1, wherein the semiconductor device includes scribe lines, and wherein the dummy path is located at the scribe lines.

4. A method for manufacturing a semiconductor device, according to claim 1, wherein the semiconductor device includes at least one field area, and wherein the dummy path is located at a field area.

5. A method for manufacturing a semiconductor device, according to claim 1, further comprising:

patterning the conductive underlayer forming a dummy conductive metal; and wherein detecting includes optically detecting.

6. A method for manufacturing a semiconductor device, according to claim 5, wherein the dummy path is located over the dummy conductive underlayer.

7. A method for manufacturing a semiconductor device, according to claim 1, further comprising:

patterning a field; and forming a dummy field pattern.

8. A method for manufacturing a semiconductor device, according to claim 7, wherein the dummy path is located over the dummy field pattern.

9. A method for manufacturing a semiconductor device, according to claim 1, wherein the semiconductor device includes a total wafer area, and wherein the etched area of the dummy path and the sub-micron path is at least about 2% of the total wafer area.

10. A method for manufacturing a semiconductor device, according to claim 1, wherein the submicron paths are created for use as vias between the conductive underlayer and another conductive layer.

11. A method for manufacturing a semiconductor device, according to claim 10, further comprising forming metal into the submicron paths used as vias.

12. A method for manufacturing a semiconductor device, according to claim 1, wherein the submicron paths are created for use as contacts.

13. A method for manufacturing a semiconductor device, according to claim 12, further comprising:

forming at least one gate stack pattern, and coupling at least one contact path to the gate stack region.

14. A method for manufacturing a semiconductor device, according to claim 12, further comprising:

forming at least one source region; and coupling at least one contact path to a source region.

15. A method for manufacturing a semiconductor device, according to claim 12, further comprising:

forming at least one drain region; and coupling at least one contact path to a drain region.

16. A method for manufacturing a semiconductor device, according to claim 12, wherein the dummy contact paths are coupled only to one type of underlayer.

17. A method for manufacturing a semiconductor device, according to claim 13, wherein at least one dummy gate stack pattern is added during a gate patterning step.

18. A method for manufacturing a semiconductor device, according to claim 17, wherein at least one dummy contact is located over a dummy gate stack pattern.

19. A method for manufacturing a semiconductor device, according to claim 12, further comprising forming metal in at least one contact path.

* * * * *